United States Patent [19]

Olson et al.

[11] Patent Number: 5,316,593
[45] Date of Patent: May 31, 1994

[54] HETEROJUNCTION SOLAR CELL WITH PASSIVATED EMITTER SURFACE

[75] Inventors: Jerry M. Olson, Lakewood; Sarah R. Kurtz, Golden, both of Colo.

[73] Assignee: Midwest Research Institute, Kansas City, Mo.

[21] Appl. No.: 977,109

[22] Filed: Nov. 16, 1992

[51] Int. Cl.5 .................. H01L 31/072; H01L 31/0304
[52] U.S. Cl. ..................................... 136/262; 257/184; 257/461
[58] Field of Search ................ 136/262; 257/184, 437, 257/461

[56] References Cited

U.S. PATENT DOCUMENTS

| | | | |
|---|---|---|---|
| 4,017,332 | 4/1977 | James | 136/246 |
| 4,107,723 | 8/1978 | Kamath | 136/262 |
| 4,179,308 | 12/1979 | Olsen et al. | 136/262 |
| 4,591,654 | 5/1986 | Yamaguchi et al. | 136/252 |

FOREIGN PATENT DOCUMENTS 60-192375 9/1985 Japan ................................. 136/262

OTHER PUBLICATIONS

S. R. Kurtz et al., *Conference Record, 21st IEEE Photovolatic Specialists Conf.* (May 1990), pp. 138–140.
Conference Record, 13th IEEE Photovolatic Specialists Conference, Jun., 1978, pp. 886–891.
IEEE Transactions on Electron Devices, vol. ED-27, No. 4, Apr., 1980, pp. 822–831.

*Primary Examiner*—Aaron Weisstuch
*Attorney, Agent, or Firm*—Ken Richardson

[57] ABSTRACT

A high-efficiency heterojunction solar cell wherein a thin emitter layer (preferably $Ga_{0.52}In_{0.48}P$) forms a heterojunction with a GaAs absorber layer. A passivating window layer of defined composition is disposed over the emitter layer. The conversion efficiency of the solar cell is at least 25.7%. The solar cell preferably includes a passivating layer between the substrate and the absorber layer. An anti-reflection coating is preferably disposed over the window layer.

20 Claims, 1 Drawing Sheet

HETEROJUNCTION SOLAR CELL WITH PASSIVATED EMITTER SURFACE

CONTRACTUAL ORIGIN OF THE INVENTION

The United States Government has rights in this invention under Contract No. DE-AC02-83H10093 between the United States Department of Energy and the National Renewable Energy Laboratory, a Division of the Midwest Research Institute.

BACKGROUND OF THE INVENTION

1. FIELD OF THE INVENTION

This invention relates generally to solar cells. More particularly, this invention relates to solar cells having a heterojunction. Even more particularly, this invention relates to solar cells having a GaAs absorber layer.

2. DESCRIPTION OF THE PRIOR ART

The current state-of-the-art GaAs solar cells having a GaAs absorber layer and a GaAs emitter layer are limited in their efficiency (less than about 24.8%) by the quality of the GaAs emitter layer. The high recombination velocity at the GaAs surface (even when passivated, e.g., with AlGaAs) reduces the $V_{oc}$, $J_{sc}$, and fill factor of these devices.

One obstacle to increasing the conversion efficiency of GaAs solar cells has been the quality of the GaAs emitter. The blue portion of the incident light spectrum is absorbed mainly in the emitter. Hence, the effective lifetime of photogenerated minority carriers in the emitter must be long enough to assure their complete collection. However, there are several loss mechanisms in the GaAs that limit this collection efficiency. First, most of the current in the device must flow laterally in the emitter. Therefore, its sheet resistance must be small. For a given emitter thickness, one is forced to use a high doping density, which in turn reduces the minority-carrier lifetime. Second, defects at the front surface also reduce the minority carrier lifetime.

U.S. Pat. No. 4,017,332 (James) discloses a cell for converting received light energy to electrical energy, comprising: four layers of differing types of semiconductive materials stacked to form three opposite conductivity junctions, wherein the outer two "active" junctions are formed of confronting layers with matched lattice constants to provide a plurality of energy converters, and the center connective junction is formed by two confronting intermediate layers which have purposely mismatched lattice constants to provide a lattice defect site surrounding the center junction.

U.S. Pat. No. 4,591,654 (Yamaguchi et al.) discloses an InP solar cell comprising a p-type InP single-crystal substrate having a defined carrier concentration and an n-type InP layer containing a dopant of at least one element selected from groups VIA including S and Se disposed on the substrate.

The publication *Conference Record, 13th IEEE Photovoltaic Specialists Conference*, June, 1978 (pp 886-14 891) discloses a (AlGa)As-GaAs-Ge dual junction cell made monolithically by depositing GaAs and Ge layers epitaxially on the back side of a state-of-the-art AlGaAs/GaAs solar cell to provide two photo voltaically-active junctions, in the GaAs and in the Ge respectively.

*IEEE Transactions on Electron Devices*, Vol. ED-27, No. 4, April 1980 (pp 822-831) discloses materials for fabrication of solar cells including the use of $Ga_xIn_{1-x}P$ (x being less than 0.35) layers to increase the efficiency of multijunction solar cells beyond that of single-junction cells.

However, these references only disclose multi- or single-junction devices that utilize GaInP, either as a buffer layer (as in the Yamaguchi et al. reference or as a homojunction material in a multijunction device.

Even though the current state-of-the-art has to a significant extent resolved many of the mechanical problems encountered by providing workable contacts to the various layers in the stack or stacking cells in a relatively efficient manner (i.e., through the use of n-on-p GaAs solar cells) these cells have been found to be limited in conversion efficiency due to the quality of the n-GaAs emitter layer. Further, in the n-on-p GaAs solar cells (and also in the p-on-n type), the high recombination velocity at the GaAs surface, even when passivated with AlGaAs, reduces the $V_{oc}$, $J_{sc}$, and the fill factor of these devices.

In copending application Ser. No. 07/976191, filed of even date and commonly assigned, there is described a single heterojunction solar cell having a GaAs absorber layer and an emitter layer comprising $Al_yGa_xIn_{1-y-x}P$, where x+y is in the range of 0.47 to 0.57.

Passivating the emitter surface in homojunction solar cells is common, but this is not previously known with respect to heterojunction solar cells. Numerous types of heterostructure solar cells are known with unpassivated emitter surfaces, e.g., CdS (emitter)/CuInSe$_2$ (absorber), CdS (emitter)/CdTe (absorber).

SUMMARY OF THE INVENTION

One object of the present invention is to provide an improved high-efficiency solar cell that surpasses the efficiency of the current state-of-the-art GaAs solar cells that are limited in efficiency to less than 24.8% due to the quality of the GaAs emitter layer.

Another object of the invention is to provide an improved high efficiency solar cell that surpasses the efficiency of the current state-of-the-art GaAs solar cell by not using the GaAs emitter layer, but instead using a thin emitter layer of $Al_yGa_xIn_{1-y-x}P$ to form a heterojunction with a GaAs absorber layer, where x+y is in the range of 0.47 to 0.57, and further including a thin passivating window layer of defined composition.

Another object of the invention is to provide an improved heterojunction solar cell which includes a passivated emitter layer to increase efficiency.

Another object of the invention is to use a passivated emitter layer of defined composition over a GaAs absorber layer in a heterojunction solar cell having a 1-sun, AM 1.5 energy conversion efficiency of greater than 25.7%.

Additional objects, advantages, and novel features of the invention shall be set forth in part in the description that follows and in part will become apparent to those skilled in the art upon examination of the following or may be learned by the practice of the invention. The objects and the advantages of the invention may be realized and attained by means of the instrumentalities and in combinations particularly pointed out in the appended claims.

To achieve the foregoing and other objects and in accordance with the purpose of the present invention, as embodied and broadly described herein, the heterojunction solar cell may comprise:

(a) a substrate (e.g., a semiconductor);

(b) an absorber layer comprising GaAs;

(c) an emitter layer in contact with the absorber layer; wherein the emitter layer comprises $Al_yGa_xIn_{1-y-x}P$, where $x+y$ is in the range of 0.47 to 0.57; and (d) a passivating window layer on the emitter layer, wherein the passivating layer comprises $Al_{y'}Ga_{x'}In_{1-y'-x'}P$, where $x'+y'$ is in the range of 0.47 to 0.57, and where y is less than y'.

Either x (or x') or y (or y') may be zero, if desired. The absorber layer may be n or p conductivity type, and the passivating and emitter layers are, correspondingly, p or n conductivity type. In other words, (1) the absorber layer, and (2) the passivating and emitter layers, are of complementar (i.e. conductivity types. The emitter layer has a band gap energy of at least 1.8 eV. The band gap energy of the passivating window layer must be greater than that of the emitter layer.

The emitter layer used in the solar cell of this invention is a semitransparent semiconductor that has a low sheet resistance, a high minority-carrier lifetime, and a lattice constant equal or very similar to that of GaAs. AlGaAs is not an ideal material for the emitter layer because its quality (or minority-carrier lifetime) is degraded by trace levels of oxygen in the material, whereas the quality of the AlGaInP emitter layer is relatively unaffected.

The improved solar cells of this invention should exhibit improved efficiencies (greater than 25%).

Other advantages of the apparatus and techniques of the invention will be apparent from the following detailed description and the accompanying drawings.

DETAILED DESCRIPTION OF THE PREFERRED EMBODIMENTS

Figure 1:
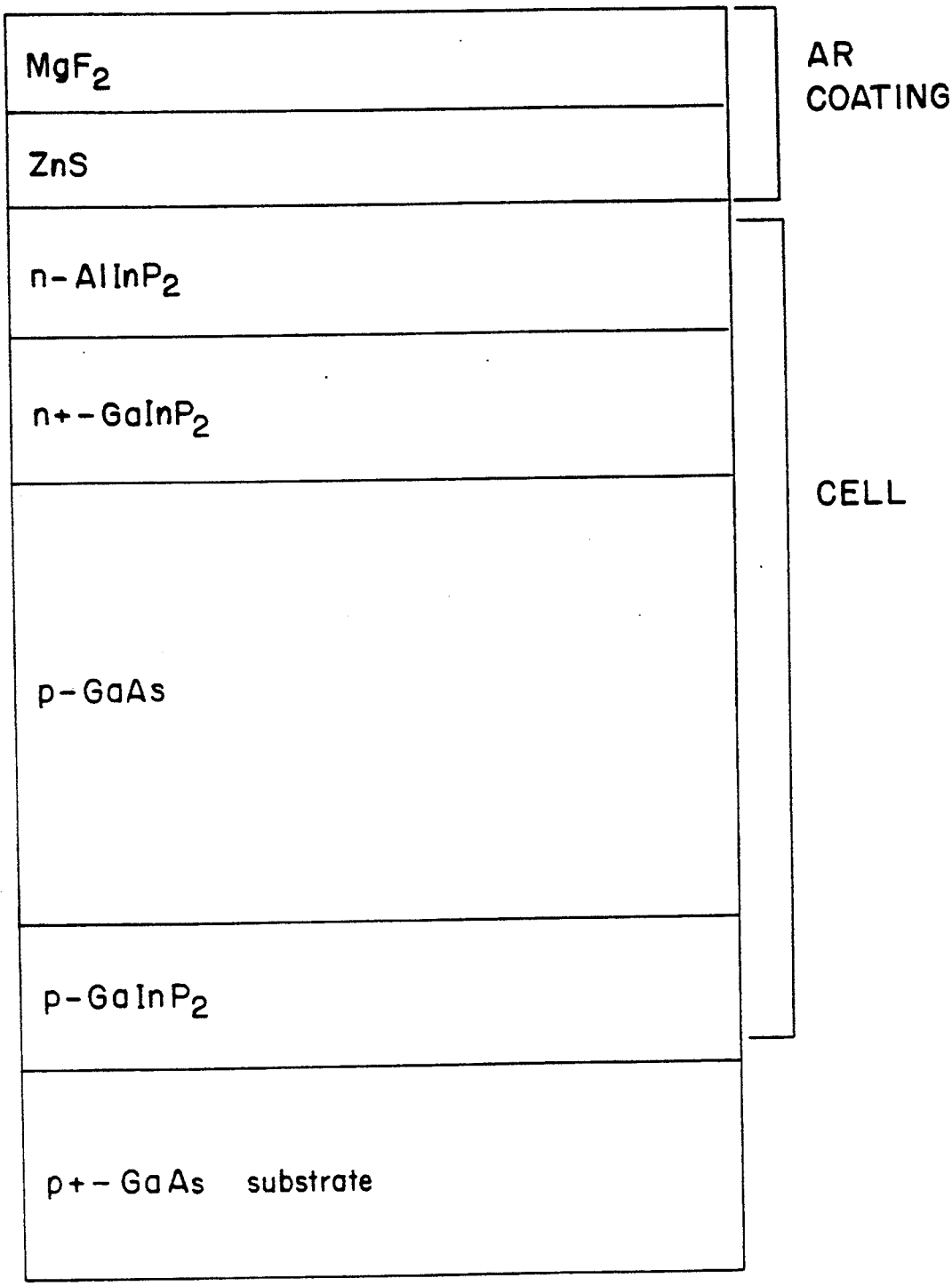
FIG. 1 shows a schematic cross section of a high-efficiency heterojunction $GaInP_2$/GaAs solar cell of the invention with an $AlInP_2$ passivating window layer, an anti-reflection (AR) coating, and a GaAs substrate.

In general, the invention pertains to the fabrication and characterization of a heterojunction solar cell with an efficiency greater than 25% (one sun, AM 1.5). The present invention addresses the problem of the limited efficiency of conventional GaAs solar cells attributed to the quality of the GaAs emitter layer and the fact that the high recombination velocity at the GaAs surface (even when passivated with AlGaAs) reduces the $V_{oc}$, $J_{sc}$, and fill factor of these solar cell devices.

A schematic of a heterojunction GaInP/GaAs solar cell having an AR coating is shown in FIG. 1. A passivating layer of p-$GaInP_2$ (p-$Ga_{0.5}In_{0.5}P$) is coated on the GaAs substrate. The structure is grown in a vertical, air-cooled reactor at one atmosphere using organometallic chemical vapor deposition (OMCVD), the detailed aspects of which are described in J. M. Olson and A. Kibbler, J. Crystal Growth, 77, 182 (1986), incorporated herein by reference. The Group III source gases were trimethylindium, trimethylgallium and trimethylaluminum; the Group V source gases were arsine and phosphine. The dopant sources were diethylzinc and hydrogen selenide.

Generally, the device described here was grown at a temperature $T_g=700°$ C. The alGaInP layers were grown at a rate of $R_g=80–100$ nm/minute and a ratio of phosphine partial pressure to trimethylaluminum plus trimethylgallium plus trimethylindium partial pressure (called the V/III ratio) of 30. For the GaAs layers, $R_g=120–150$ nm/minute and V/III$=35$. Also, the absorber was doped with Zn to a nominal level of $0.5–4\times10^{17}$ cm$^{-3}$, and the emitter layer was doped with Se at about $10^{18}$cm$^{-3}$. However, the optoelectronic properties and photovoltaic quality of the materials set forth above are complex and coupled functions of $T_g$, V/III, dopant type and concentration, substrate quality, and the precise composition of the AlGaInP alloy. See S. R. Kurtz, J. M. Olson and A. Kibbler, Applied Physics Letters, 57, 1922 (1990), incorporated herein by reference. Therefore, it is possible that one skilled in the art could find a set of conditions, composition, and dopant type and concentration that will yield even higher efficiencies.

The front and back contacts of these devices were electroplated with gold. A high dopant concentration is used in both the GaAs substrate and the top contacting layer (not shown), and therefore, no thermal annealing of either contact is required. The front contact is defined by photolithography and obscures approximately 5% of the total cell area. The cell perimeter is also defined by photolithography and a mesa etch that uses a sequential combination of concentrated hydrochloric acid and an ammonia:peroxide:water solution. The ammonia/peroxide solution is also used to remove the contacting layer between the gold grid fingers. The anti-reflection (AR) coating preferably is a double layer of evaporated ZnS and $MgF_2$, with thicknesses of 0.12 and 0.065 microns, respectively.

The best efficiency measured for this device is 25.7% (one sun, air mass 1.5). The short-circuit current density ($J_{sc}$), open-circuit voltage ($V_{oc}$), and fill factor (FF), were 28.65 mA cm$^{-2}$, 1.038V, and 86.42%, respectively. This is the highest efficiency reported for a heterojunction solar cell photovoltaic device and represents a significant improvement over the current, state-of-the-art GaAs solar cells, that are limited in efficiency to less than 24.8% by the quality of the GaAs emitter layer.

The thickness of the emitter layer may generally vary from about 500 to 2000 angstroms. Of course, if an electrically conductive anti-reflection coating is present over the emitter layer, then the emitter layer can be very thin (e.g., 20 angstroms).

The emitter layer must have sufficient conductivity so as not to limit the fill factor. Also, the emitter layer must not be so thick as to reduce the $V_{oc}$ and $J_{sc}$.

The emitter layer may be represented by the formula $Al_yGa_xIn_{1-y-x}P$ where $x+y$ is in the range of 0.47 to 0.57. The passivating window layer may be represented by the formula $Al_{y'}Ga_{x'}In_{1-y'-x'}P$, where $x'+y'$ is in the range of 0.47 to 0.57 and y' is greater than y. The greater aluminum content of the window layer (as compared to the aluminum content of the emitter layer) is important for the following reasons: (1) it increases the band gap energy of the window layer and makes it more transparent, and (2) it acts as a mirror for minority carriers and thereby increases $J_{sc}$, $V_{oc}$ and fill factor.

The emitter layer is approximately lattice-matched with the absorber layer (i.e., coherent epitaxy is required). The band gap energy of the emitter layer is at least 1.8 eV and may be higher.

The passivating window layer is approximately latticematched with the emitter layer. The band gap energy of the window layer must be greater than the band gap energy of the emitter layer. For example, the band gap energy of the passivating window layer may be 2.5 eV or higher.

The thickness of the passivating window layer may vary from about 50 to 2000 angstroms. If the window layer is too thin the layer will leak minority carriers and will not effectively passivate the emitter layer. If the window layer is too thick it will absorb light and reduce efficiency of the solar cell.

The thickness of the absorber layer may vary in thickness. A preferred thickness is in the range of about 1 to 5 microns. The band gap energy of the absorber layer is about 1.42 eV.

Generally, the absorber layer and the substrate are of the same conductivity type (either n- or p-type). The emitter layer and passivating window layer are of opposite conductivity type than the absorber layer.

Preferably a passivating layer is disposed between the substrate and the absorber layer. The purpose of the passivating layer is to prevent recombination and holes at the back surface of the absorber layer. The passivating layer is of the same conductivity type as the absorber layer.

Various types of passivating materials are known for use between the substrate and the absorber layer, e.g., $GaInP_2$, AlGaAs, ZnSe, etc.

The substrate is preferably GaAs. Other useful substrates include germanium, silicon, GaInP, AlGaAs, alone or on silicon.

If desired, an optical mirror could be included at the back surface of the absorber layer, or at the top surface of the substrate. The use of a mirror to reflect light back through the absorber layer is well known in the art.

The advantages of using the passivating window layer on the emitter layer in solar cells of this invention are illustrated in the following examples.

| Example No. | Cell Structure | $V_{oc}$ | $J_{sc}$ | FF | n |
|---|---|---|---|---|---|
| 1 | With $AlInP_2$ window layer | 0.99 | 19.3 | 0.87 | 1.03 |
| 2 | without $AlInP_2$ | 0.92 | 17.1 | 0.84 | 1.34 |

The presence of the $AlInP_2$ passivating window layer increases the $V_{oc}$, $J_{sc}$ and FF by 7.6%, 12.9% and 3.6%, respectively. The notation "n" refers to the diode quality factor, and a value of 1.0 indicates a high-quality device. Also, the emitter layer of the solar cell of Example 1 can exhibit photoluminescence lifetimes in excess of 400 nsec. This is several orders of magnitude larger than that measured for the solar cell of Example 2. Further, the spectral response of the solar cell of Example 1 shows marked improvement in photoresponse of the emitter layer as compared to Example 2.

The foregoing is considered as illustrative only of the principles of the invention. Further, because numerous modifications and changes will readily occur to those skilled in the art, it is not desired to limit the invention to the exact construction and operation shown and described, and accordingly all suitable modifications and equivalents may be resorted to falling within the scope of the invention as defined by the claims which follow.

The embodiment of the invention in which an exclusive property or privilege is claimed are as follows:

1. A high-efficiency heterojunction solar cell comprising:
    (a) a substrate;
    (b) an absorber layer comprising GaAs supported by said substrate;
    (c) an emitter layer in contact with said absorber layer; wherein said emitter layer comprises $Al_{y'}Ga_xIn_{1-y-x}P$, where $x+y$ is in the range of 0.47 to 0.57; and wherein said emitter layer has a band gap energy of at least 1.8 ev; and
    (d) a passivating window layer on said emitter layer, wherein said window layer comprises $Al_{y'}Ga_{x'}In_{1-y'-x'}P$, where $x'+y'$ is in the range of 0.47 to 0.57,
    wherein said absorber layer and said emitter layer are of opposite conductivity types; and wherein y is less than y'.

2. A solar cell in accordance with claim 1, wherein said substrate is a semiconductor selected from the group consisting of GaAs, Ge, Si, and GaInP.

3. A solar cell in accordance with claim 2, further comprising a passivating layer disposed between said substrate and said absorber layer.

4. A solar cell in accordance with claim 3, wherein said passivating layer comprises $GaInP_2$.

5. A solar cell in accordance with claim 3, wherein said emitter layer comprises $Ga_{0.52}In0.48P$ and said window layer comprises $AlInP_2$.

6. A solar cell in accordance with claim 2, wherein said substrate and absorber layers are p-type, and said emitter and window layers are n-type.

7. A solar cell in accordance with claim 1, further comprising an anti-reflection coating over said window layer.

8. A solar cell in accordance with claim 7, wherein said anti-reflection coating comprises layers of ZnS and $MgF_2$.

9. A high-efficiency heterojunction solar cell comprising:
    (a) a semiconductor-substrate;
    (b) a passivating layer on said substrate;
    (c) an absorber layer supported on said passivating layer; said absorber layer comprising GaAs;
    (d) an emitter layer in contact with said absorber layer; wherein said emitter layer comprises $Al_{y}Ga_xIn_{1-y-x}P$, where $x+y$ is in the range of 0.47 to 0.57; and wherein said emitter layer has a band gap energy of at least 1.8 eV; and
    (e) a passivating window layer on said emitter layer, wherein said window layer comprises $Al_{y'}Ga_{x'}In_{1-y'-x'}P$, where $x'+y'$ is in the range of 0.47 to 0.57,
    wherein said absorber layer and said emitter layer are of opposite conductivity types; and wherein y is less than y'.

10. A solar cell in accordance with claim 9, wherein said substrate is a semiconductor selected from the group consisting of GaAs, Ge, Si, and GaInP.

11. A solar cell in accordance with claim 9, wherein said passivating layer comprises $GaInP_2$.

12. A solar cell in accordance with claim 9, wherein said substrate and absorber layers are p-type, and said emitter and window layers are n-type.

13. A solar cell in accordance with claim 9, further comprising an anti-reflection coating over said window layer.

14. A high-efficiency heterojunction solar cell comprising:
    (a) a semiconductor substrate;
    (b) an absorber layer comprising GaAs supported by said substrate;
    (c) an emitter layer in contact with said absorber layer; wherein said emitter layer comprises $Al_{y'}Ga_xIn_{1-y-x}P$, where $x+y$ is in the range of 0.47 to 0.57; and wherein said emitter layer has a band gap energy of at least 2.3 eV; and (d) a passivating window layer on said emitter layer, wherein said window layer comprises $Al_{y'}Ga_{x'}In_{1-y'-x'}P$, where $x'+y'$ is in the range of 0.47 to 0.57; wherein said absorber layer and said emitter layer are of opposite conductivity types; and wherein y is less than y'.

15. A solar cell in accordance with claim 14, wherein said substrate is a semiconductor selected from the group consisting of GaAs, Ge, Si, and GaInP.

16. A solar cell in accordance with claim 15, further comprising a passivating layer disposed between said substrate and said absorber layer.

17. A solar cell in accordance with claim 16, wherein said passivating layer comprises $GaInP_2$.

18. A solar cell in accordance with claim 15, wherein said substrate and absorber layers are p-type, and said emitter and window layers are n-type.

19. A high-efficiency heterojunction solar cell comprising:

(a) a substrate;
(b) an absorber layer supported by said substrate;
(c) an emitter layer in contact with said absorber layer; wherein said emitter layer comprises $Al_{y}Ga_{x}In_{1-y-x}P$, where $x+y$ is in the range of 0.47 to 0.57; and wherein said emitter layer has a band gap energy of at least 1.8 eV; and
(d) a passivating window layer on said emitter layer, wherein said window layer comprises $Al_{y'}Ga_{x'}In_{1-y'-x'}P$, where $x'+y'$ is in the range of 0.47 to 0.57. wherein said absorber layer and said emitter layer are of opposite conductivity types; and wherein y is less than y'.

20. A solar cell in accordance with claim 19, further comprising a passivating layer disposed between said substrate and said absorber layer.

* * * * *